United States Patent
Eklund

(10) Patent No.: US 6,392,575 B1
(45) Date of Patent: May 21, 2002

(54) PARALLEL ANALOG-TO-DIGITAL CONVERTER HAVING RANDOM/PSEUDO-RANDOM CONVERSION SEQUENCING

(75) Inventor: Jan Erik Eklund, Linköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/598,769

(22) Filed: Jun. 22, 2000

(30) Foreign Application Priority Data

Jun. 23, 1999 (SE) .............................................. 9902416

(51) Int. Cl.[7] .............................................. H03M 1/10
(52) U.S. Cl. ........................................ 341/141; 341/118
(58) Field of Search ................................... 341/118, 141

(56) References Cited

U.S. PATENT DOCUMENTS

| | | |
|---|---|---|
| 4,345,241 A | 8/1982 | Takeuchi et al. |
| 5,585,796 A | 12/1996 | Svensson et al. |

FOREIGN PATENT DOCUMENTS

| | | |
|---|---|---|
| JP | 60-29028 | 2/1998 |

OTHER PUBLICATIONS

Eklund, J. et al. Digital Offset Compensation of Time–Interleaved ADC using Random Chjopper Sampling, 2000 IEEE International Sympiosioum on Circuits and Systems (ISCAS 2000), IEEE, May 28–31, 2000, vol. 3 pp. 447–450.*

Huawen, J. et al. Time–Interleaved A/D Converter with Channel Randomization, 1997 IEEE International Sympiosioum on Circuits and Systems (ISCAS 1997), Jun. 9–12, 1997 vol. 1 pp. 425–428.*

Dyer, K. et al, A Comparison of Monolithic Background Calibration in Two Time–Interleaved Analog–to–Digital Converters, 1998 IEEE International Symposium on Circuits and Systems (ISCAS '98), IEEE, May 31–Jun. 3, 1998, vol. 1, pp. 13–16.*

\* cited by examiner

*Primary Examiner*—Howard L. Williams
(74) *Attorney, Agent, or Firm*—Burns, Doane, Swecker & Mathis, L.L.P.

(57) ABSTRACT

In a parallel Analog-to-Digital Converter (ADC) device a number of ADCS work in parallel, the conversion processes in each ADC overlapping the processes in the other ADCs. The number of ADCs and the sampling period at which samples arc taken and new conversion processes are periodically started in the ADCs are selected so that at each instant, at least one ADC is idling not performing any conversion. After the conversion is made by one of the ADCs, a choice is made whether the next sampled value is to be converted by this ADC or by the idling ADC. This choice can be made in a random or a pseudo-random way. Undesired tones existing in the composite output signal of parallel ADC devices having no such extra ADC are transferred to noise, as the error in the output signal caused by differences in the conversion characteristics of the ADCs is distributed in the frequency domain.

2 Claims, 5 Drawing Sheets

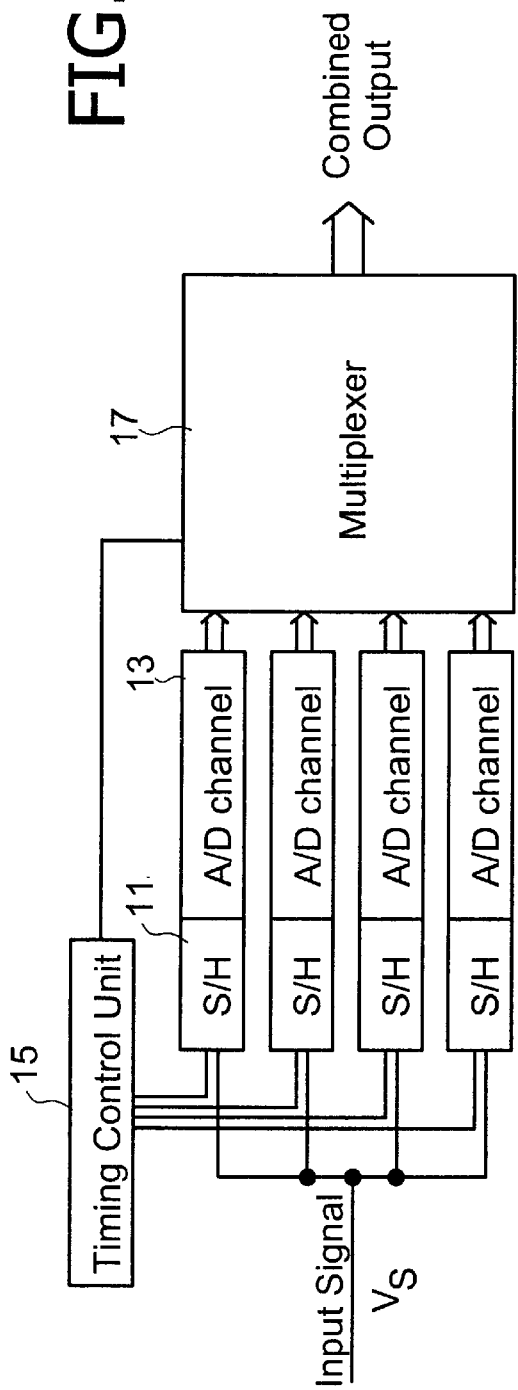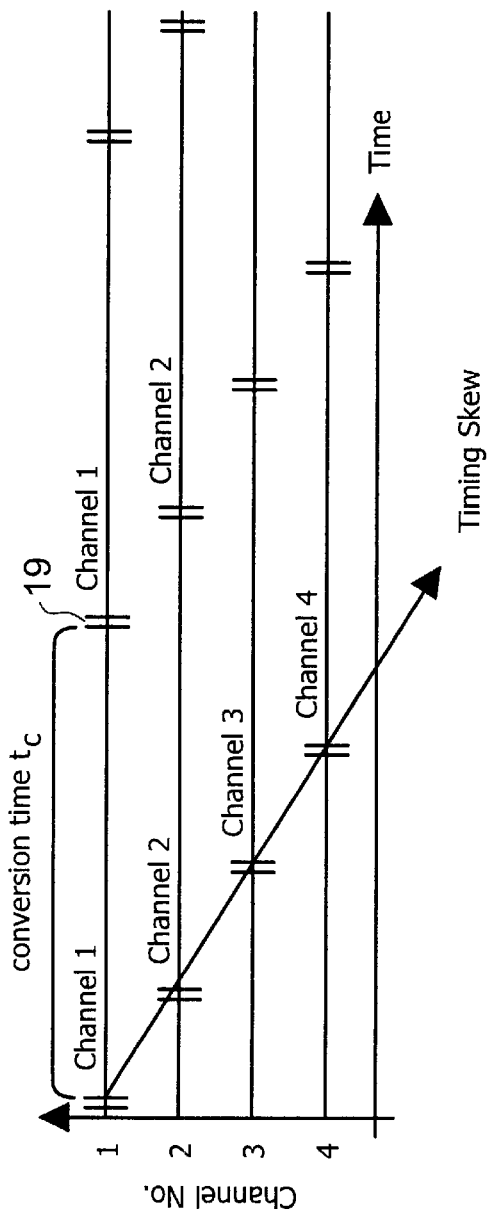

4 ADC cells with errors

5 ADC cells with errors and random selection

PARALLEL ANALOG-TO-DIGITAL CONVERTER HAVING RANDOM/PSEUDO-RANDOM CONVERSION SEQUENCING

This application claims priority under 35 U.S.C. §§119 and/or 365 to 9902416-8 filed in Sweden on Jun. 23, 1999; the entire content of which is hereby incorporated by reference.

BACKGROUND

The present invention relates to a parallel analog-to-digital converter and to a method of converting analog values to digital values in parallel, independently working processes.

In wireless communication equipment incoming signals often have to be converted to a digital shape. Also, digital signals to be issued from the equipment often have be converted to an analog shape. A schematic of a typical simple circuit used in such communication is illustrated in FIG. 1. An analog-to-digital converter (ADC) 1 is connected to a line 5 through and delivers digital data to a signal processor 9 which communicates with user circuits, not shown, to forward information thereto. In actual embodiments the ADC has a transfer function which always includes errors. The errors result in a degraded performance in terms of the signal-to-noise ratio (SNR) and spurious free dynamic range (SFDR). In a typical application, the line 5 is connected to some device 8 for radio frequency receiving which uses an antenna 10.

A single analog-to-digital converter can be too slow for some applications. Then, a plurality of single or individual ADCs, called ADC cells or ADC channels, are arranged which convert the successive sampled values in a cyclic process, the conversion in each cell being performed in parallel with or multiplexed in time with the conversion in the other cells, the conversion process starting at successive times for the successively sampled analog values. Such a composite device is called a parallel ADC device (PSA-ADC), see e.g. U.S. Pat. No. 5,585,796 for Christer M. Svensson et al. In FIG. 2 such a parallel ADC device having m parallel channels is schematically illustrated. The input analog signal $V_S$ is sampled by successively closing switches in sample and hold circuits $11_1, 11_2, \ldots, 11_m$, one for each ADC $13_1, 13_2, \ldots, 13_m$, as controlled by clock signals from a time control unit 15, to make the instantaneous value of $V_S$ to be held or stored in respective sample and hold circuit. The ADC connected to a sample and hold circuit compares the value held therein to reference values. The ADCs deliver the output words on output lines to a multiplexer 17, from which a flow of digital words is obtained as an output of the total device. The band width of the total signal information from the composite device will thus be a multiple of the bandwidth from a single ADC channel.

In FIG. 3 a timing diagram of the conversion process in the composite ADC device of FIG. 2 is shown. It is observed that for each ADC there is a time period of length $t_c$ in which the conversion of a sampled value is executed followed by a short intermediate time period indicated at 19, which can have a length equal to 0.

Each channel repeats the conversion process with a frequency $f_c$, the conversion time $t_c$ thus being smaller than $1/f_c$, i.e. $1/f_c > t_c$. The conversion frequency of the total device is then $f_{c,tot} = m \cdot f_c$. In an ADC device a sufficient number of parallel cells is arranged to make this total conversion frequency as high as required. The sloping line in FIG. 3 shows the time skew of the ADC cells, the starting times between successive cells determining the slope which is then equal to $1/(m \cdot f_c)$. If an ADC device has to have a total conversion frequency of $f_{c,tot}$ and the conversion time is $t_c$ for a single cell, the required number m of parallel cells is given by: $m = f_{c,tot}/f_c = f_{c,tot} \cdot (1/f_c) > f_{c,tot} \cdot t_c$ and is generally selected to be the smallest integer satisfying this condition.

The cells in such a parallel ADC device always work in a predetermined successive order. Furthermore, in a parallel ADC device the individual converters will each have some characteristic or systematic errors like e.g. jitter and gain errors differing from the characteristics or systematic errors of the other converter elements, This will generate undesired tones in the output signal of the parallel ADC device such as tones having a frequency corresponding to $x \cdot f_c \pm f_{in}$, where x is an integer and $f_{in}$ is a frequency representing an error in the individual ADC channels. These patterns will generally restrict the dynamic range of the composite ADC device.

SUMMARY

It is an object of the invention to provide a parallel ADC device having an increased dynamic range.

It is another object to provide a parallel ADC device in which the amplitude of undesired tones caused by differences of the characteristics in the element ADCs are reduced.

In a parallel ADC device a number of element converter devices are provided which work in parallel for determining digital values from analog values periodically sampled with a predetermined sampling period or sampling frequency from an input analog signal. The number of element devices and the sampling period/frequency are selected so that at each instant at least one element converter device and this is not active not performing any conversion. After the conversion is made by an element device, the next sampled value is converted by this element device or by a previously idling element device. This selecting of the next element device to perform a conversion is controlled by a choice generator providing some signal pattern. This signal pattern controls a selector which actually makes the selecting. The choice generator can provide a sequence of numbers distributed at random or a sequence having a long repetition period such as obtained from a pseudo-random generator. Also a sequence having a short period such as 0, 1, 0, 1, . . . can be used in some cases.

By controlling the choice of the next element device to make a conversion in a random way or in some systematic way having a sufficient period, the pattern in the composite output signal of the parallel ADC device comprising undesired tones is transformed to noise. The total energy of the error caused by the differences of the conversion characteristics of the element devices from each other is approximately the same as for an ADC having no idling element device but the error is distributed in the frequency domain. In some cases the noise caused by said differences can even be lower than the quantization noise.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which;

FIG. 2 is a block diagram of a parallel ADC device,

FIG. 3 is a diagram illustrating the conversion times of the cells in a parallel ADC device.

DETAILED DESCRIPTION

Figure 1:
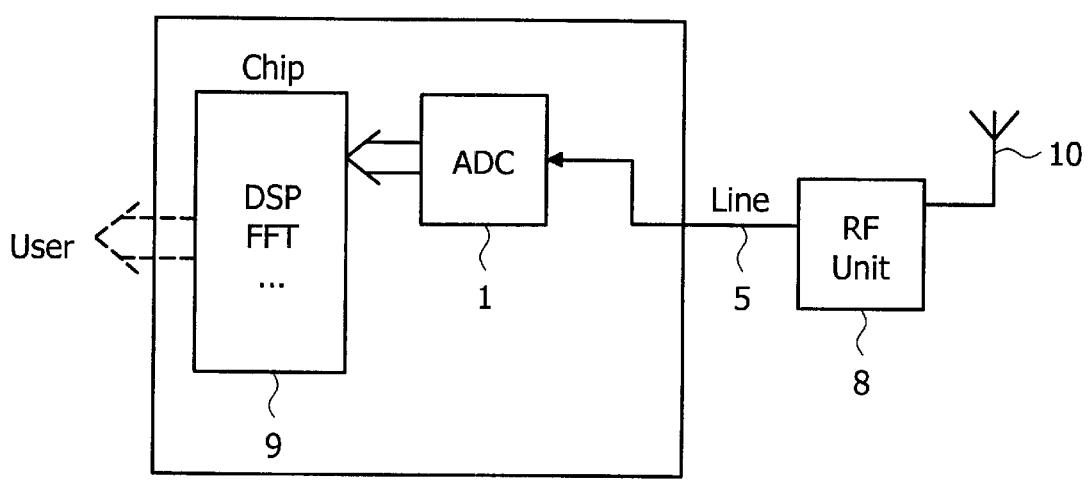
FIG. 1 is a schematic of devices for receiving radio signals.
Figure 4:
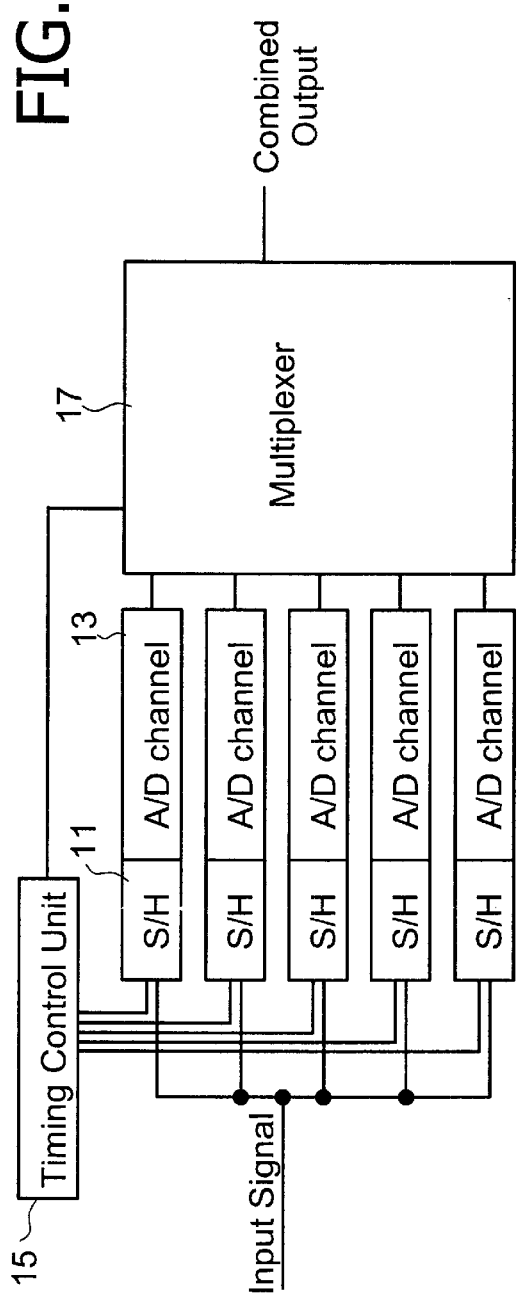
FIG. 4 is a block diagram of a parallel ADC device having an idling conversion channel.

In FIG. 4 a parallel ADC device generally being similar to the prior art device described in conjunction with FIG. 2 but having (m+1) parallel channels is schematically illustrated. In the figures m is chosen to be equal to four but in the general case m can be any number greater than 1. The input analog signal $V_S$ is sampled by sample and hold circuits $11_1, 11_2, \ldots, 11_{m+1}$, one for each ADC $13_1, 13_2, \ldots, 13_{m+1}$, as controlled by clock signals from a time control unit $15'$, to make the instantaneous value of the analog signal to be held or stored in respective sample and hold circuit. The clock signals are generated at a uniform rate to sample the analog input signal at periodically occurring times. The ADC connected to a sample and hold circuit compares the value held therein to reference values, The ADCs deliver the output words on output lines to a multiplexer 17, from which a flow of digital words having the same rate as the sampling rate is obtained as an output of the total device, each output digital word representing the input analog signal at a time being a predetermined period, the latency or delay period of the conversion device, before the delivery of the output word.

Figure 5:
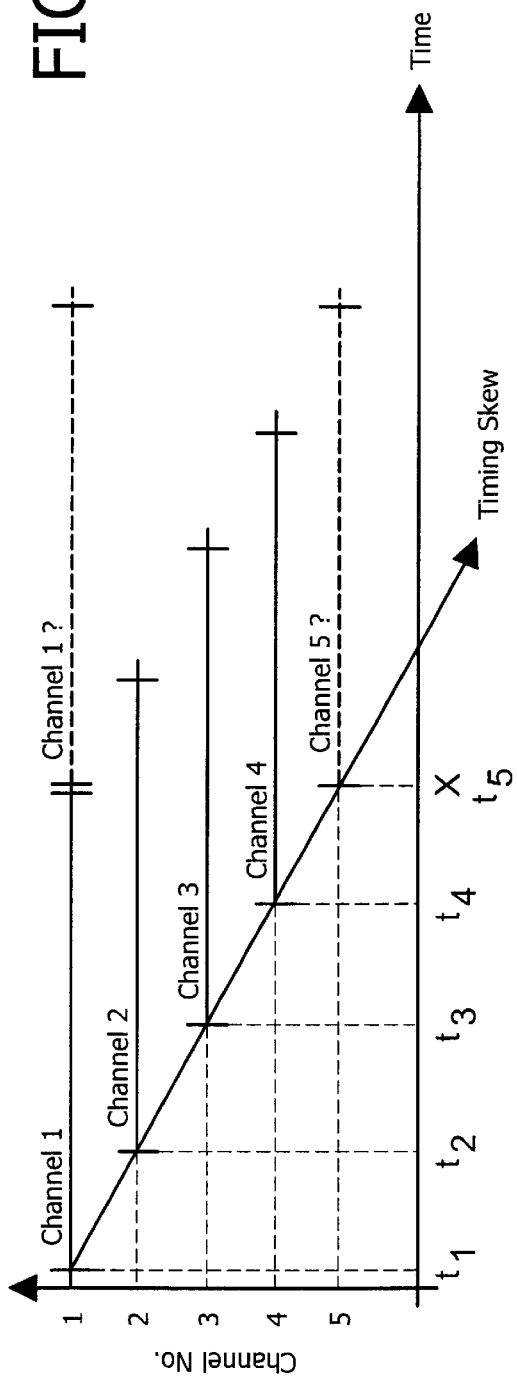
FIG. 5 is a diagram illustrating the conversion times of the cells in the parallel ADC device of FIG. 4.

In FIG. 5 a timing diagram exemplifying the conversion process is shown. In particular it is observed that for each ADC there is a time period of length $t_c$ in which the conversion of a sampled value is executed. Each channel can thus repeat the conversion process with a maximum frequency $f_{c,max}=1/t_c$. However, only m ADC cells work in parallel at each instant, this implying that at each instant someone of the ADC cells is always idling. The conversion frequency of the total device then is $f_{c,tot} \geq m \cdot f_{c,max}$ and is determined by the slope of the sloping line in FIG. 3. Each individual cell works, except at thus times when it is idling, at a rate $f_c = f_{c,tot}/m \leq f_{c,max}$. A condition on the number (m+1) of cells is obtained from this inequality: $m \geq f_{c,tot}/f_{c,max} = f_{c,tot} \cdot t_c$ and thus $m+1 \geq f_{c,tot} \cdot t_c + 1$. The number (m+1) of cells can generally be selected to be the smallest integer satisfying this condition.

In the example of FIG. 5 where five parallel channels are used and thus m=4, the clock signals for starting the conversion are given at a regular rate at times $t_1, t_2, t_3, \ldots$ Channel 1 starts the conversion of a sampled value at the time $t_1$, channel 2 starts the conversion at the successive time $t_2$, the channel 3 starts the conversion at the time $t_3$ and channel 4 starts the conversion at the time $t_4$. At the next time $t_5$, the conversion in channel 1 is finished and channel 5 has not been started and thus both channel 1 and 5 can be used for the conversion of the next analog sampled value. The choice of channel is then in a first case made in a systematic way and in a second case in a random way or at least in pseudo-random way based on the signal from a respective generator of random or pseudo-random numbers, A pseudo-random number generator can in the conventional way be made as a sequence of shift registers connected to each other in a predetermined way to obtain a generator of a Pseudo Random Binary Sequence, a PRBS-generator, If the generator produces an output signal indicating a logical one, e.g. the channel is chosen which has been ready to receive a new sampled value for the shortest time. If the generator produces an output signal indicating a logical zero the channel can be chosen which has been ready to receive a new sampled value for the longest time.

Figure 6:
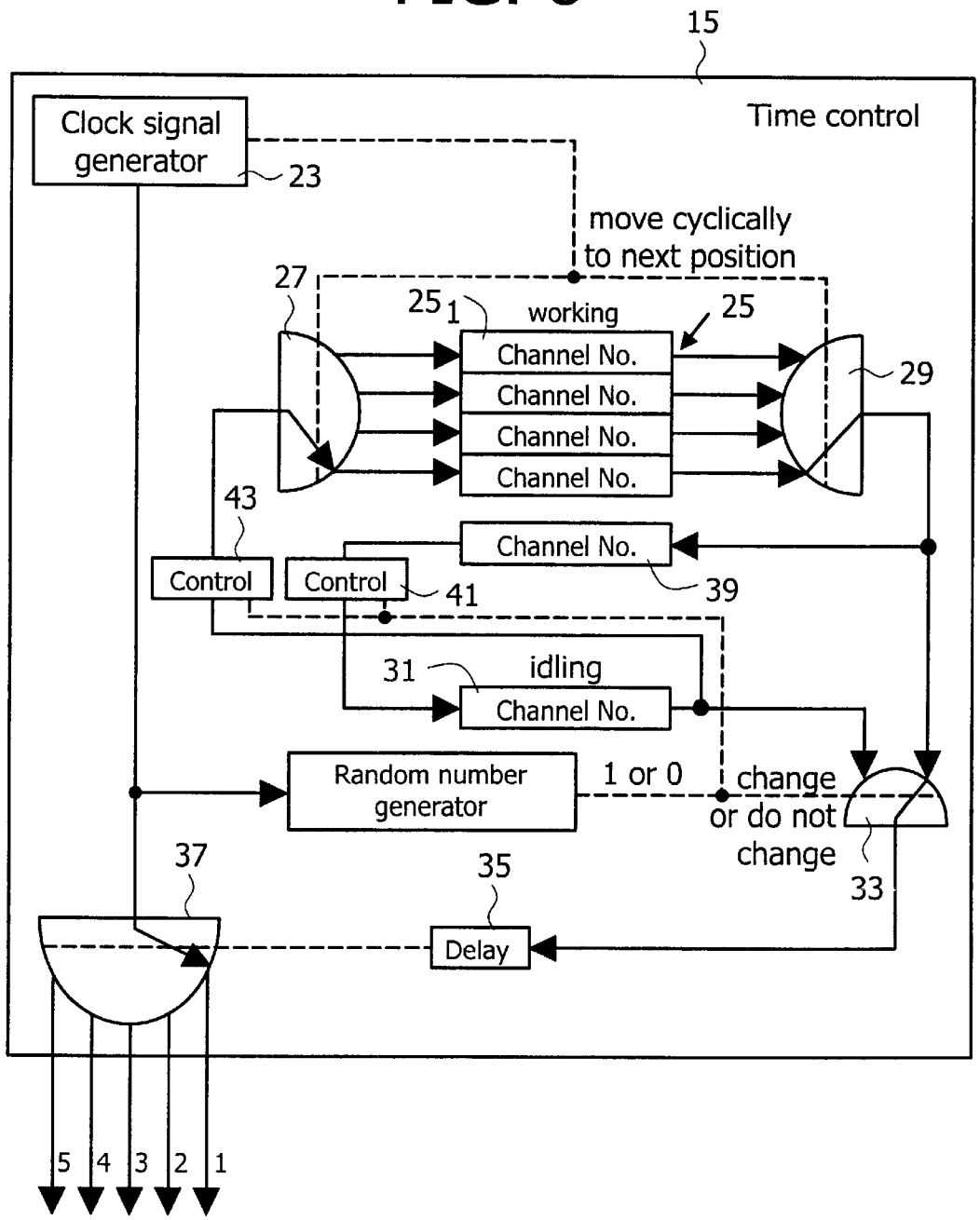
FIG. 6 is a block diagram of a time control unit used in the parallel ADC device of FIG. 4.

The time control unit of FIG. 4 thus has to comprise a generator controlling the choice. In the block diagram of the time control unit in FIG. 6 the generator is a random number generator 21 providing a sequence of binary "ones" and "zeroes" distributed at random. Said bits are provided at the times defined by clock signals from a clock signal generator 23. The clock signals also control four registers 25: $25_1, 25_2, 25_3, 25_4$ holding in a cyclical sequence the numbers of the active channels which at each instant perform a conversion operation. A 1:4 selector 27 and a 4:1 selector 29 are connected at the input and output sides respectively of the four registers 25 for active channels. The control inputs of the selectors 27, 29 are connected to the clock signal generator 23 and are controlled by the clock signal to change the selectors one step cyclically for each clocking pulse.

Another register 31 always holds the number of the channel which currently is inactive or idling. The output side of the register for the idle channel is connected to one input of a 2:1 selector 33, which also receives at the other input a line from the output of the 4:1 selector 29 at the output side of the registers 25. This 2:1 selector is controlled to forward a channel number from one of its inputs as controlled by the signal from the choice generator 21, so that it will forward the number on the input from the 4:1 selector 29 for a binary "zero" and the number on the input from the register 31 for the idle channel for a binary "one". The selected channel number is forwarded from the output of the 2:1 selector 33 to control, through a delay circuit 35, a 1:5 selector 37 having its input connected to the clock signal generator 23 and the five outputs connected to the sample and holds circuits $11_1, \ldots$, see FIG. 4.

In order to allow an interchange of the contents of the register for the idle channel and the register holding the channel which has currently finished its conversion operation, an intermediate register 35 is provided in which is stored the number of the channel which is currently selected by the two selectors 27, 29. The input side of the intermediate register 35 is thus connected to the output side of the 4:1 register on the output side of the registers 25. The output side of the intermediate register 31 is through a control circuit 41 connected to the register 31 for the idle channel, the control circuit 41 being connected to the choice generator 21 to also receive the bit sequence. The output side of the register 31 for the idling channel is also connected through a control circuit 43 to the input side of the 1:4 selector 27 on the input side of the registers 25.

The operation of the time control unit 15 is the following. When a new clocking pulse is issued by the clock signal generator 23, the clock signal passes through the output 1:5 selector 37 to the selected j:th output thereof and to the sample and hold circuit 11$_j$ for the selected channel, This starts the conversion process in the j:th channel. At the same time the clocking pulse moves two selectors 27, 29 at the input and output sides of the registers 25 for active channels to the next register 25$_i$ in a cyclical order. Then that register 25$_i$ is selected by the two selectors which has finished its conversion time a short time period before the clocking pulse. The channel number stored in that register 25$_i$ is fed to the input of the 2:1 selector 33, on the other input of which is provided the number of the idling channel from the register 31. The position of the 2:1 selector 33 is controlled by the output signal of the choice generator 21, which when receiving the clocking pulse outputs a new bit. The chosen one of the numbers of the ready channel and the idling channel is through the delay circuit 35 provided to the output selector 37 and changes the position thereof to the correct output. The number of the ready channel has then been copied to the intermediate register 39. As controlled by the control units 41, 43 responsive to the output bit of the choice generator 21, only for a bit signifying a logical "one", the channel number stored in the register 31 for the idling channel is copied to the register 25$_i$ as selected by the selector 27 at the input side of the active channel registers 25 and thereafter the channel number stored in the intermediate register 39 is copied to the register 31 for the idling channel.

Figure 7:
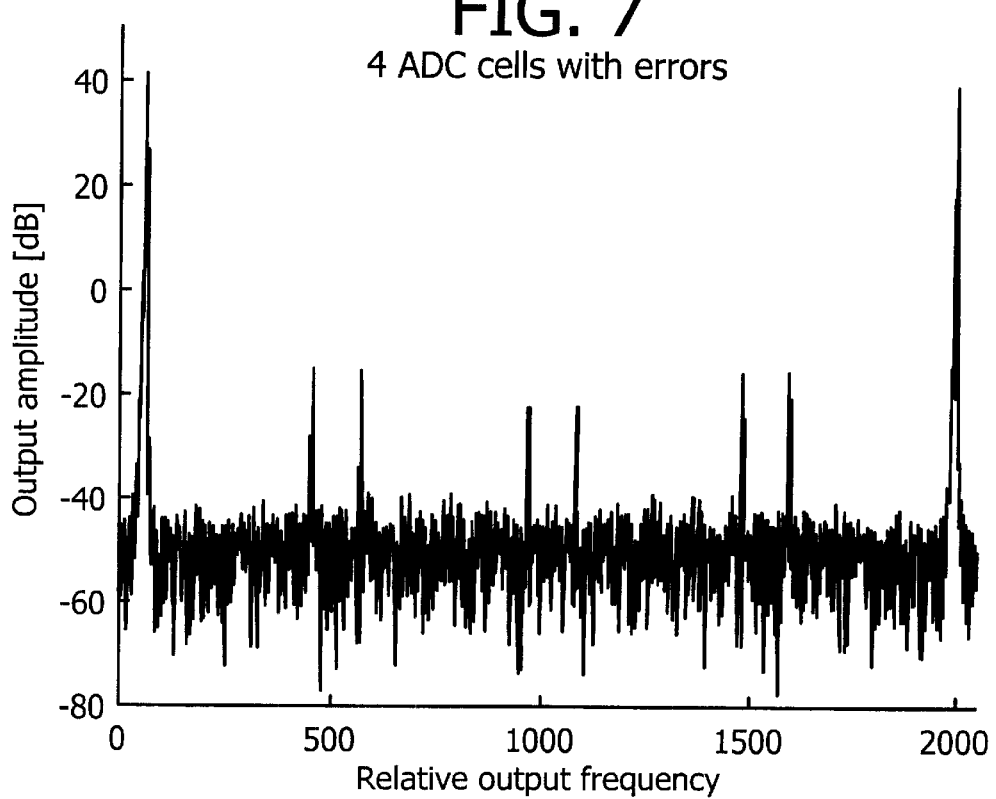
FIG. 7 is a simulated histogram of output codes obtained from a parallel ADC having no idling channel.
Figure 8:
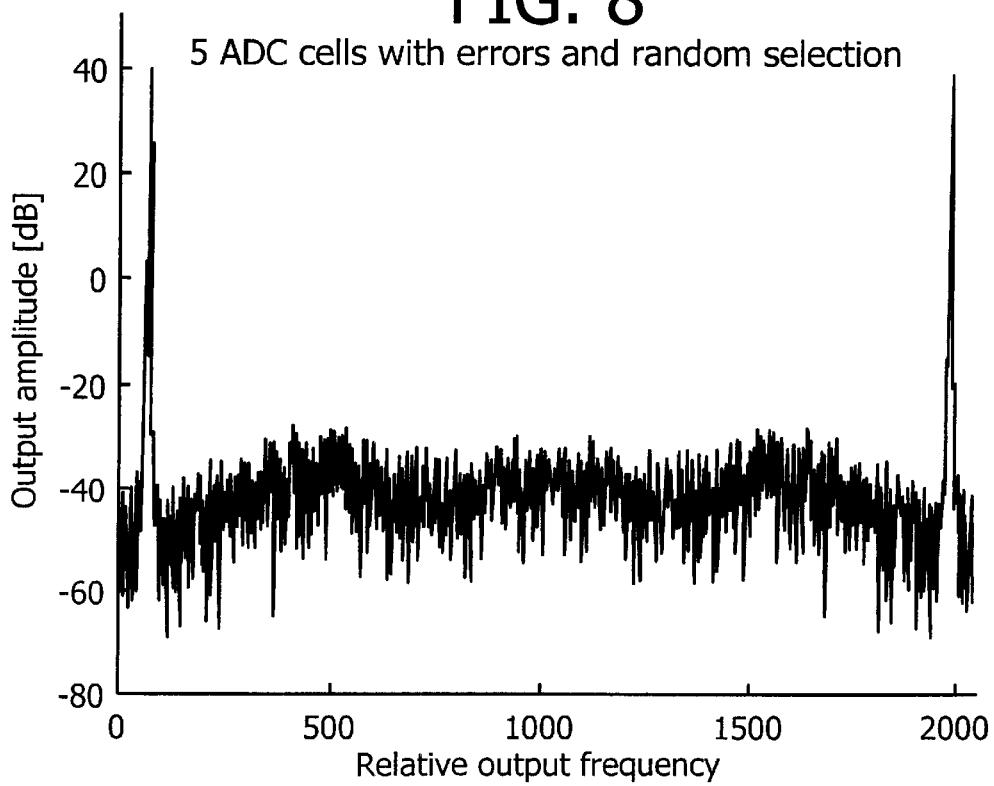
FIG. 8 is a simulated histogram of output codes obtained from a parallel ADC having an idling channel.

As mentioned above, a parallel ADC device has systematic errors like e.g. jitter and gain errors, i.e. the individual ADCs have characteristics differing from each other, e.g. the gain being different for the individual ADCs. The systematic errors or differences cause undesired tones in the output, combined signal of the composite ADC device. These tones restrict the dynamic range of the parallel ADC device. When the next channel to make a conversion is selected in a random way or in some systematic way having a sufficient period among at least two individual ADCs, the pattern of undesired tones which can be called a signal distortion is transformed to noise. The total energy of the error is still approximately the same but the characteristics thereof have been totally changed. The error is now distributed in the frequency domain and is not collected at some peaks. In some cases the noise can be lower than the quantification noise and has then practically disappeared. This is illustrated by the histograms of FIGS. 7 and 8. Thus, in FIG. 7 a simulated histogram of output codes is drawn as obtained from a conventional parallel ADC configured as illustrated in FIG. 2. It is observed that some output codes are more frequent or less frequent than other codes in a repetitive fashion, as already discussed in the introduction. The term "output codes" refers to the digital output values of the ADC device. The histogram of output codes in FIG. 8 is obtained by simulating, using the same input signal as for the histogram of FIG. 7, a parallel ADC having an idling channel operating in the manner described above. It is seen that the histogram is much smoother than that of FIG. 7 and in particular there are no values being much more frequent or infrequent than other values.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A parallel converter device comprising:

an input terminal for receiving an analog signal;

an output terminal;

a predetermined number of element converter devices connected to the input terminal and working in parallel for determining digital values from analog values successively sampled, at times periodically repeated with a predetermined sampling period, from an analog signal received on the input terminal, each element device being arranged to provide, after a conversion time period smaller or equal to the sampling period, a digital value representing a sampled analog value to the output terminal, the predetermined number of element converter devices and the sampling period being selected such that at any given moment at least one of the element converter devices is idling and not determining a digital value from an analog value;

a selector connected to the element converter devices for selecting, after a conversion period of an element converter device, between one of said element converter devices and the at least one converter device which is idling, to determine a digital value from a next sampled analog value; and a choice generator connected to the selector, the choice generator providing one of a random and a pseudo-random control signal to enable the selector to randomly or pseudo-randomly select between one of said element converter devices that has finished determining a digital value in a previous conversion period and the at least one converter device which is idling, to determine a digital value from a next sampled analog value.

2. A method of converting an analog signal to a sequence of digital values, the method comprising the steps of:

sampling, at times periodically repeated within a predetermined sampling period, the analog signal to provide sampled analog values;

determining for each analog value a digital value, the determination being made in one of a predetermined number of independently working parallel processes, each determination requiring a predetermined conversion time period smaller than or equal to the sampling period;

combining the determined digital values to form a sequence; and choosing, at the instant when a next analog value is sampled, which one of at least two of the parallel processes is to start determining a digital value for the next analog value in one of a random and a pseudo-random manner, the at least one non-chosen parallel process idling and not making any determination of digital values until an analog value is again sampled;

wherein the choosing is made between one of the parallel processes that has finished determining a digital value in a sampling period before said instant and at least one of the parallel processes that has not made any determination of digital values during the sampling period before said instant.

* * * * *